United States Patent [19]

Asai et al.

[11] Patent Number: 5,547,557

[45] Date of Patent: Aug. 20, 1996

[54] FORMATION OF ELECTROCONDUCTIVE THIN-FILM PATTERN

[75] Inventors: Hiroki Asai, Neyagawa; Yuji Omata, Toyonaka, both of Japan

[73] Assignee: Matsushita Electric Industrial Co., Ltd., Osaka-fu, Japan

[21] Appl. No.: 335,904

[22] Filed: Oct. 20, 1994

[30] Foreign Application Priority Data

Oct. 20, 1993 [JP] Japan .................................. 5-262179

[51] Int. Cl.⁶ ............................ C25D 5/02; C25D 5/54; C25D 5/56; C25D 5/50
[52] U.S. Cl. ..................... 205/118; 205/119; 205/122; 205/159; 205/165; 205/176; 205/224; 205/228
[58] Field of Search ................................ 205/118, 119, 205/122, 159, 165, 176, 224, 228, 255

[56] References Cited

U.S. PATENT DOCUMENTS 5,318,094  6/1994  Joy et al. .................................. 164/98

FOREIGN PATENT DOCUMENTS

| 59-229727 | 12/1984 | Japan . |
| 3-287789  | 12/1991 | Japan . |
| 5-082587  | 4/1993  | Japan . |
| 5-114601  | 5/1993  | Japan . |
| 6-081173  | 3/1994  | Japan . |

*Primary Examiner*—John Niebling
*Assistant Examiner*—Edna Wong
*Attorney, Agent, or Firm*—Wenderoth, Lind & Ponack

[57] ABSTRACT

A process for forming an electroconductive thin-film coil element uses an InNi alloy film which is heated to a temperature above its melting point and melted off together with an electrode used for electroplating.

4 Claims, 3 Drawing Sheets

FORMATION OF ELECTROCONDUCTIVE THIN-FILM PATTERN

FIELD OF THE INVENTION

The present invention relates to a process for forming an electroconductive thin-film pattern using the electroplating method. A representative example of the electroconductive thin-film pattern is a coil pattern for a thin-film magnetic head which is used with a magnetic disc apparatus.

BACKGROUND OF THE INVENTION

Recently, increased recording density has been desired in the area of magnetic recording. For attaining a high recording density, magnetic heads used in a hard disc drive have been changing from a ferrite head, which is conventionally used, to a thin-film magnetic head whose magnetic head element is formed by integrating technique which has been representatively used in the production of semiconductors. FIG. 2 is a plain view of a thin-film magnetic head, in which element 1 an insulating substrate or a head slider substrate; element 9 is an upper magnetic core and element 6 is a coil whose ends are connected to coil leads 7. The coil 6 is contained in a coil insulating layer 8. FIG. 3 is a sectional view at an X–X' cutting line shown in FIG. 2, in which an insulating layer 10 is formed on the insulating substrate 1. The insulating layer 10 is generally made of $Al_2O_3$ or $SiO_2$. After forming a lower magnetic core 11 on the insulating layer 10, a non-magnetic gap layer 12 is formed from the same material as the insulating layer 10. Over the gap layer 12, coil layers 6 are formed and covered with an insulating layer 8 which conforms to the shape of the coil layers 6. The insulating layer 8 is generally made of a heat-cured positive-type photoresist. On the insulating layer 8, an upper magnetic core 9 is formed and then a protective film 13 is formed thereon.

The thin-film magnetic head, as mentioned above, is required to have higher accuracy and higher integrating density. In the system for magnetic recording, high recording density enhances the sensitivity of a magnetic head, or enhances its output, because the leakage of the magnetic field, i.e. the information from the recording medium, becomes smaller. Since the output of the magnetic head is in proportion to number of coil windings, it is desirable to narrower the distance between coil wires and the width of the coil wire to result in an increase is the number of windings. This is also important in view of integrating magnetic head elements, because it is liable to make a magnetic head itself smaller.

FIGS. 4 A to 4 E schematically show a conventional process for forming a coil element. In FIG. 4 A, a base electrode 104 for coil plating is formed on an insulating substrate 101 by a dry process, such as sputtering, and then a mask 105 for coil plating is formed thereon with a photoresist, using photolithography (FIG. 4 (b)). Coil layers 106 are formed by electroplating (FIG. 4 (c)), and the mask 105 for coil plating is removed with a removing solution, such as an organic solvent (FIG. 4 (d)). Next, a portion of the base electrode 104, on which the photoresist mask 105 had been present, is removed by etching to form a coil pattern (FIG. 4 (e)).

In order to make the coil element small, to increase number of coil windings and to elevate an aspect ratio (a ratio of coil layer thickness/coil wire width), the coil wire width has been made narrower in comparison with a conventional coil element. The narrowed coil wire width, however, make it difficult or time consuming to remove the base electrode 104 between the coil layers 106. This often adversely affects on reduction of coil thickness, etching of coil side surface and the like, because the etching solution simultaneously erodes the coil layers 106. This defect is overcome by making the coil base electrode thin, but adhesivity between the coil and the surface of the insulating substrate, and uniformity of coil layers are poor.

SUMMARY OF THE INVENTION

In order to obviate the above defects, an alloy film having a lower melting point (e.g. an InNi alloy) is formed on a portion between coil wires. A base electrode for coil plating is formed on the alloy film. After forming coil layers, the alloy film is heated to a temperature above the melting point, melting off the alloy film to simultaneously remove the base electrodes between the coil wires. It is already proposed in Japanese Kokai Publication Hei 3 (1991)-287789 that the InNi alloy is applicable to the fine processing of thin-films, but the reference neither suggests nor teaches that the alloy film is used for producing the coil elements and has overcome problems associated with the production of the coil element.

The present invention is to provide a process for forming an electroconductive thin-film pattern on an insulating substrate, comprising:

forming a metal layer having a low melting point on the insulating substrate:

patterning the metal layer to form a patterned low melting point metal layer:

forming a base electrode layer for electroplating the electroconductive film pattern over the substrate having the patterned low melting point metal layer:

forming a photoresist layer on the portion having the patterned low melting point metal layer:

forming the electroconductive film pattern by electroplating on the portions other than the photoresist layer:

removing the photoresist layer: and heating the substrate to a temperature above the melting point to melt the patterned low melting point metal layer, thereby enabling it to be removed.

DETAILED DESCRIPTION OF THE INVENTION

FIGS. 1 A to 1E schematically show the process for forming an electroconductive thin-film coil element according to the present invention. In this coil element, width of the coil wire is 2 μm and the distance between coil wires is about 1 μm. The coil layers are made of copper by electroplating.

Figure 1A:
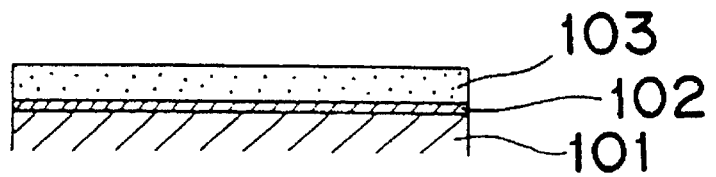
FIGS. 1 A to 1E schematically show the process for forming an electroconductive thin-film coil element according to the present invention.
Figure 1B:
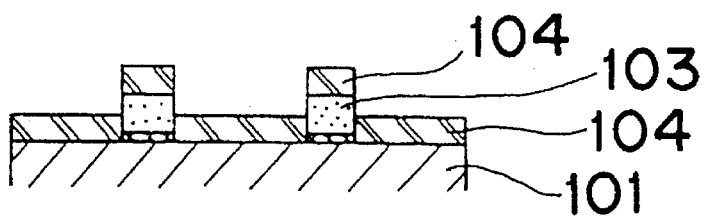
Figure 1C:
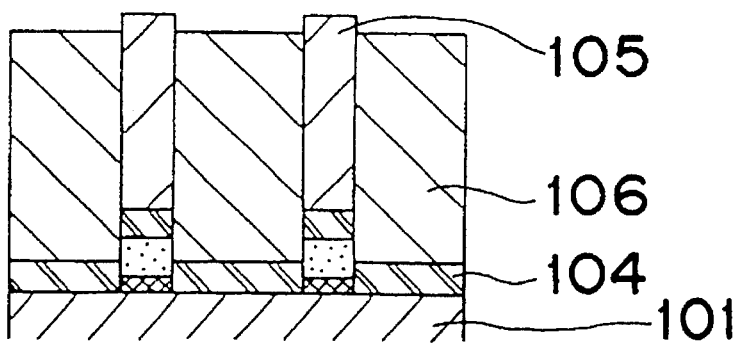
Figure 1D:
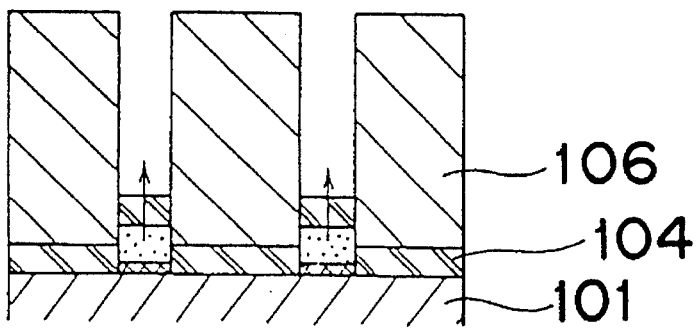
Figure 1E:
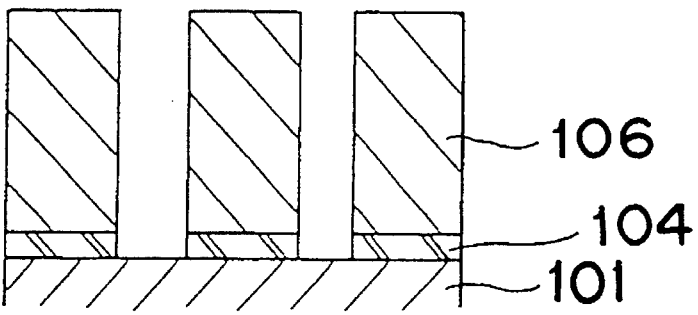
Figure 2:
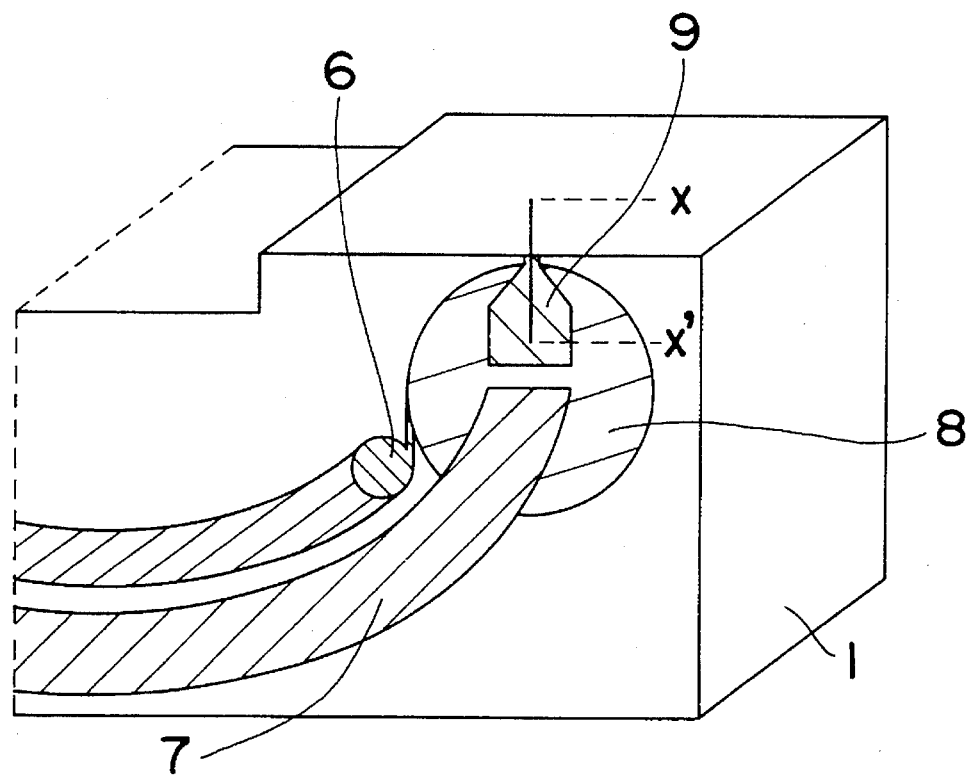
FIG. 2 shows a plain view of a thin-film magnetic head.
Figure 3:
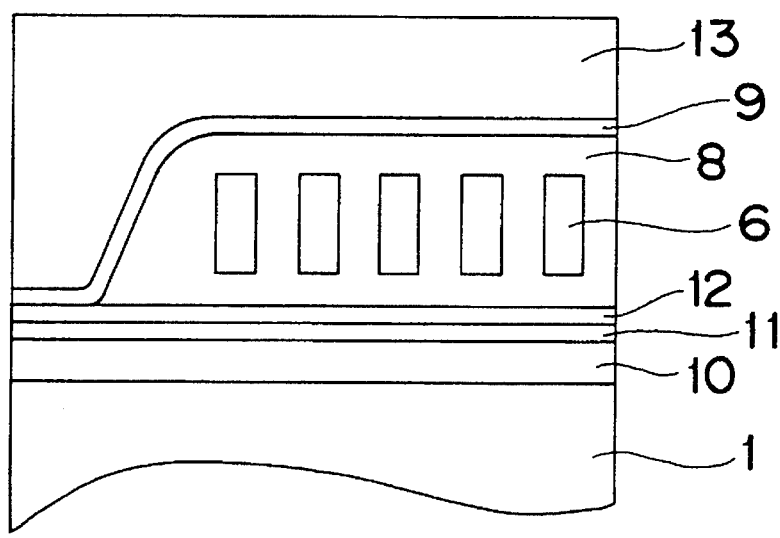
FIG. 3 shows a sectional view at an X–X' cutting line in FIG. 2.
Figure 4A:
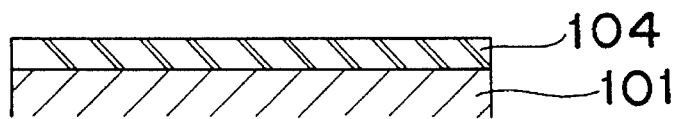
FIGS. 4 A to 4 E schematically show a conventional process for forming a coil element.
Figure 4B:
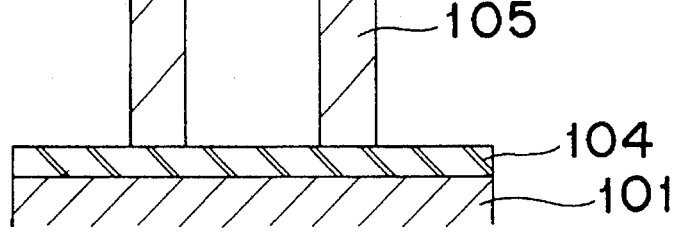
Figure 4C:
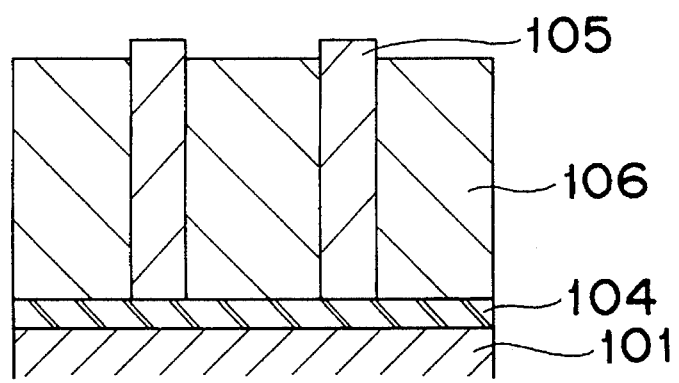
Figure 4D:
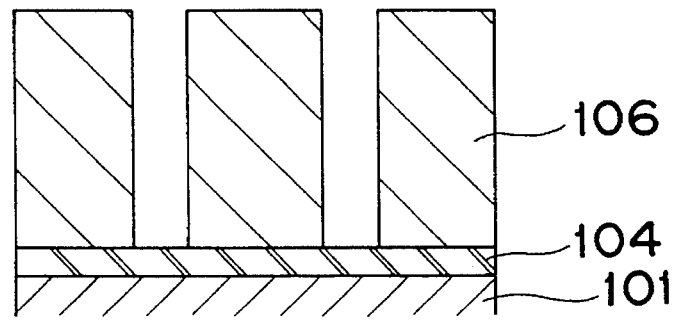
Figure 4E:
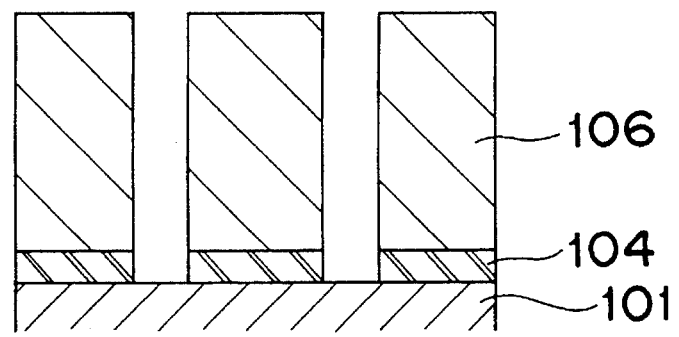

As shown in FIG. 1A, a base electrode layer 102 for electroplating the low melting point alloy layer, having a thickness of 30 nm, is formed on an insulating substrate 101 by sputtering. The base electrode layer 102 is made of copper which is the same as the coil layers 106, but may be made of chromium or titanium. On the base electrode layer 102, a low melting point metal layer 103 having a thickness of 300 nm is electroplated using the base electrode layer 102 as a plating electrode. In the preferred embodiment of the present invention, the low melting point metal layer 103 is generally an InNi alloy and electroplating is conducted in an electroplating bath containing In ions ($In^{3+}$) and Ni ions ($Ni^{2+}$) which are derived from indium sulfate and nickel sulfate. It is preferred that an amount ratio of In Ions/Ni ions based on the molar ratio is adjusted to about 1/30. A direct current having a current density of 4 $mA/cm^2$ is applied to the electroplating bath.

The resulting metal layers 102 and 103 are so patterned by photolithography that the remaining metal layers 102 and 103 are present on portions between coil layers 106. In this context, the term "photolithography" means a technique by which the metal layer is patterned by a lithographic method using a photoresist. For example, a photoresist is formed on the metal layers and patterned by exposing to light through a photomask, followed by etching the metal layers on which no photoresist layer is formed.

Then, a base electrode 104 for electroplating the coil layers 106 is formed thereon by sputtering, and has a thickness of about 150 mn (FIG. 1 (b)). In this process, the base electrode 104 is preferably copper, but may be made of chromium or titanium.

On the base electrode 104, another photoresist layer 105 is formed and exposed to light through a mask film having a pattern, followed by developing to form a photoresist mask on the portions between the coil layers 106. It is then copper-plated in a copper sulfate solution to plate copper layers (i.e. coil layers 106) on the exposed base electrode 104 on which no photoresist mask is formed (FIG. 1 (c)). An applied current has a current density of about 20 $mA/cm^2$, and the resulting coil layers 106 have a thickness of about 6 μm.

Next, the photoresist layers 105 present between the coil layers 106 are removed with a remover, such as an organic solvent, and then the element is heated to a temperature above the melting point of the low melting point alloy, for example 150° C. This heating process melts off the low melting point alloy layers 103 and simultaneously removes the base electrodes 104 present on the low melting point alloy layers (FIG. 1 (e)).

Finally, the base (copper) electrode 102 for the low melting point alloy layer 103 is removed by, for example, chemical etching with an aqueous solution of ammonium persulfate. The base electrode 102 to be etched has a thickness 30% less than the conventional process and the etching time is reduced. The etching process simultaneously etches the formed coil layers 106, because the base electrode 102 is made of copper which also forms the coil layers 106. However, the thickness of the coil layers 106 to be etched is less than 50 nm and therefore a reduction of the coil layers 106 is effectively inhibited.

The process of the present invention reduces the removing time by etching the electrode between the coil layers 106 and does not injure the adhesivity between the insulating substrate 101 and the coil layers 106.

What is claimed is:

1. A process for forming an electroconductive thin-film pattern on an insulating substrate, comprising:

forming a metal layer having a low melting point on the insulating substrate;

patterning the metal layer to form a patterned low melting point metal layer;

forming a base electrode layer for electroplating the electroconductive film pattern over the substrate having the patterned low melting point metal layer;

selectively forming a photoresist layer by photolithography on portions having the patterned low melting point metal layer;

forming the electroconductive film pattern by electroplating on portions other than the portions having the photoresist layer;

removing the photoresist layer; and heating the substrate to a temperature above the melting point to melt the patterned low melting point metal layer, thereby enabling it to be removed.

2. The process according to claim 1, wherein the electroconductive thin-film pattern is a coil of a thin-film magnetic head coil.

3. The process according to claim 1, wherein said low melting point metal layer is made of an InNi alloy.

4. The process according to claim 3, wherein said InNi alloy is formed by electroplating in a solution containing In ions and Ni ions.

* * * * *